US008501299B2

(12) United States Patent
Ikeda et al.

(10) Patent No.: US 8,501,299 B2
(45) Date of Patent: Aug. 6, 2013

(54) CONDUCTIVE PASTE, MULTILAYER CERAMIC SUBSTRATE AND ITS PRODUCTION METHOD

(75) Inventors: Hatsuo Ikeda, Kumagaya (JP); Koji Ichikawa, Kumagaya (JP)

(73) Assignee: Hitachi Metals, Ltd., Tokyo (JP)

( * ) Notice: Subject to any disclaimer, the term of this patent is extended or adjusted under 35 U.S.C. 154(b) by 1413 days.

(21) Appl. No.: 12/161,848

(22) PCT Filed: Jan. 23, 2007

(86) PCT No.: PCT/JP2007/050993
§ 371 (c)(1),
(2), (4) Date: Jul. 23, 2008

(87) PCT Pub. No.: WO2007/083811
PCT Pub. Date: Jul. 26, 2007

(65) Prior Publication Data
US 2009/0011201 A1    Jan. 8, 2009

(30) Foreign Application Priority Data

Jan. 23, 2006  (JP) ................................. 2006-013994
Apr. 5, 2006   (JP) ................................. 2006-104383

(51) Int. Cl.
*B32B 3/24*     (2006.01)
*B32B 5/16*     (2006.01)
*B32B 37/24*    (2006.01)

(52) U.S. Cl.
USPC ........... 428/139; 428/131; 428/137; 428/138; 428/140; 428/208; 428/901; 427/97.2; 427/97.7; 427/98.3

(58) Field of Classification Search
USPC .............. 428/131, 139, 140, 137, 138, 208, 428/901; 427/97.2, 97.7, 98.3
See application file for complete search history.

(56) References Cited

U.S. PATENT DOCUMENTS 5,665,459 A     9/1997  Fukuta et al.
6,855,399 B2 *  2/2005  Sumi et al. ................... 428/209

FOREIGN PATENT DOCUMENTS

| | | |
|---|---|---|
| EP | 1 083 578 A1 | 3/2001 |
| JP | 01-107591 A | 4/1989 |
| JP | 1-138793 A | 5/1989 |
| JP | 03-256289 B2 | 11/1991 |
| JP | 04-097594 A | 3/1992 |
| JP | 6-314517 A | 11/1994 |
| JP | 6-334351 A | 12/1994 |
| JP | 7-82041 A | 3/1995 |
| JP | 08-274470 A | 10/1996 |
| JP | 2000-285731 A | 10/2000 |
| JP | 2001-285731 A | 10/2001 |
| JP | 2002-198660 A | 7/2002 |
| JP | 2003-162922 A | 6/2003 |
| JP | 2004-319706 A | 11/2004 |

* cited by examiner

*Primary Examiner* — William P Watkins, III
(74) *Attorney, Agent, or Firm* — Sughrue Mion, PLLC

(57) ABSTRACT

A conductive paste comprising 88-94% by mass of Ag powder having an average particle size of 3 μm or less and 0.1-3% by mass of Pd powder, the total amount of the Ag powder and the Pd powder being 88.1-95% by mass. A multilayer ceramic substrate obtained by laminating and sintering pluralities of ceramic green sheets, and having conductor patterns and via-conductors inside, the via-conductors being formed in via-holes having diameters of 150 μm or less after sintering, containing Ag crystal particles having a particle size of 25 μm or more, and having a porosity of 10% or less.

5 Claims, 2 Drawing Sheets

CONDUCTIVE PASTE, MULTILAYER CERAMIC SUBSTRATE AND ITS PRODUCTION METHOD

This is a 371 application of PCT/JP2007/50993 filed Jan. 23, 2007, claiming the priority of Japanese Patent Application Nos. 2006-013994 filed Jan. 23, 2006 and 2006-104383 filed Apr. 5, 2006, the contents of which are incorporated by reference in their entirety.

FIELD OF THE INVENTION

The present invention relates to a multilayer ceramic substrate having semiconductors, chip parts, etc. mounted thereon, and capacitors and coils contained therein, which are connected to each other with high dimensional precision and reliability, and its production method, and a conductive paste used therefor.

BACKGROUND OF THE INVENTION

In recent years, semiconductor LSIs, chip parts, etc. have been being miniaturized with narrower terminal pitches, and multilayer ceramic substrates, on which they are mounted, are required to have narrower pitches with higher dimensional precision. Multilayer ceramic substrates widely used at present are insulating, sintered alumina substrates, on which wirings of high-melting-point metals such as tungsten, molybdenum, etc. are formed. However, because high-melting-point metals such as tungsten, molybdenum, etc. have large electric resistance, and large high-frequency loss, they cannot be used in parts needing low-resistance wiring and high-frequency parts. Thus, low-temperature-sinterable multilayer ceramic substrates, on which low-resistance metals such as copper, silver, gold, etc. are used in place of metals such as tungsten, molybdenum, etc., have been finding applications particularly in parts for cell phones. When low-melting-point metals such as copper, silver, gold, etc. are used, multilayer ceramic substrates should be densely sintered at as low temperatures as about 800-1000° C. The low-temperature-sinterable multilayer ceramic substrates are those made of low-temperature-co-firable ceramics (LTCC), which are called "LTCC substrates."

In a sintering step for forming multilayer ceramic substrates, the ceramics shrink about 10-20%. Because of variations in quality among inorganic material powder lots, in composition among binders for green sheets and in particle size among powders constituting green sheets, etc., it is extremely difficult to keep a constant shrinkage ratio. Shrinkage ratios may vary nearly ±1% among lots. Also, because internal circuit patterns or surface conductor patterns formed by pastes of low-melting-point metal powder such as silver are different from ceramics in sintering shrinkage, the sintered LTCC substrates suffer deformation such as warp. To reduce such shrinkage ratio variations and deformation, circuit patterns inside or on the surface should be selected depending on green sheet lots, or a ceramic paste applied to the top and bottom surfaces of the laminate should have different shrinkage ratios.

To solve such problems, Japanese Patent 2554415 discloses a method comprising bringing a flexible constraint layer comprising non-metal inorganic particles dispersed in an organic binder into contact with a surface of a ceramic green body formed by a mixture comprising ceramic powder dispersed in an organic binder and a sinterable inorganic binder (glass component), evaporating the organic binder from both of the ceramic green body and the constraint layer, sintering them, and removing the constraint layer from the sintered ceramic body. In this method, the sinterable inorganic binder contained in the ceramic green body penetrate into the constraint layer as deep as 50 μm or less to bond the ceramic green body to the constraint layer, but the constraint layer of inorganic particles is not substantially sintered, so that it does not shrink, thereby suppressing the shrinkage of the ceramic green body attached to the constraint layer in a lamination plane (X-Y plane). Thus, the sintering method with suppressed shrinkage in an X-Y plane is called "shrinkage-constraining method."

Recent trends of miniaturizing and thinning multilayer ceramic substrates, increasing the number of elements, and making circuit structures more complicated have made internal conductor patterns and via-conductors finer. Most via-conductors now have via-hole diameters of 150 μm or less after sintering, but smaller via-conductors of 100 μm and 80 μm in diameter will be needed in the future. Because fine via-holes formed by a laser are tapered, their bottoms have even smaller diameters. The reduction of via-hole diameters turns their aspect ratios (length/diameter) larger. Thus, conventional conductive pastes do not have enough fillability (chargeability), leaving large space after sintering. Such space lowers reliability in the connection between upper and lower electrodes, provides high resistance to via-conductors, and causes impregnation with a plating solution in some cases.

Because green sheets shrink about 10-20% in a usual free-sintering method, via-holes and printing patterns before sintering have large sizes taking shrinking margins into consideration. However, because no shrinkage occurs in an X-Y direction in the shrinkage-constraining method, via-holes and printing patterns before sintering should be smaller than in the free-sintering method. The shrinkage-constraining method thus needs smaller via-holes and via pads at the time of printing. Also, the thickness reduction of about 30-50% occurs in the shrinkage-constraining method because of no shrinkage in an X-Y direction, green sheets should be thicker to achieve the targeted thickness after sintering. Accordingly, via-holes to be printed should have larger aspect ratios in the shrinkage-constraining method than in the free-sintering method, resulting in more difficult filling of a conductor into the via-holes.

JP 2000-285731 A discloses a method for producing a multilayer ceramic substrate by sintering laminated green sheets and heat-shrinkage-constraining sheets attached to both surfaces thereof, in which a glass-frit-free, conductive paste comprising conductor powder, 95% by weight or more of which is Ag powder having an average particle size of 3-10 μm, and an organic vehicle, is filled into via-holes formed in the green sheets. Because sintering does not generate large deviation between the conductive paste and the green sheets in this method, gaps are unlikely provided between via-conductors and the substrate, with cracking also unlikely in the substrate. However, via-holes with smaller diameters and larger aspect ratios lower the fillability of a conductive paste into the via-holes, failing to achieve sufficient performance.

JP 1-107591 A discloses the production of an electric circuit board with improved solderability by applying a conductor composition comprising silver powder and rhodium powder and/or an organic rhodium compound dispersed in a vehicle, without substantially containing glass frit as an inorganic binder, to a substrate of glass or a low-temperature-sinterable ceramic, and sintering it. However, this reference is silent about the diameters of via-holes, and the fillability of the conductor composition into the via-holes. It is considered that the fillability of the conductor composition into the via-holes would be remarkably reduced, if the via-holes had smaller diameters and larger aspect ratios.

JP 8-274470 A discloses a multilayer circuit board obtained by laminating pluralities of layers provided with conductor patterns, comprising via-holes formed between conductor patterns on each layer, and via-conductors filled into the via-holes for connecting the conductor patterns, the outer surfaces of via-conductors containing pluralities of voids of about 1-5 μm in diameter being closely attached to the inner walls of via-holes. However, because the formation of voids needs a large amount of inorganic materials, the via-conductors have high resistance.

JP 2002-198660 A discloses a method for producing a multilayer circuit board comprising forming pluralities of thermal via-holes in each green sheet with a conductive paste comprising Ag powder having an average particle size of 5 μm or more and Ag powder having an average particle size of 1 μm or less, so that heat can be efficiently dissipated from semiconductor parts. However, because this conductive paste does not fill the via-holes enough, sufficient connection cannot be achieved between upper and lower wiring electrodes, and the circuit board has low reliability because of the impregnation of a plating solution, etc.

OBJECTS OF THE INVENTION

Accordingly, an object of the present invention is to provide a multilayer ceramic substrate having small-diameter via-holes with good fillability of a conductive paste, so that the via-holes are sufficiently packed with a conductor after sintering.

Another object of the present invention is to provide a conductive paste suitable for such a multilayer ceramic substrate.

A further object of the present invention is to provide a method for producing such a multilayer ceramic substrate.

DISCLOSURE OF THE INVENTION

As a result of intense research in view of the above objects, the inventors have found that in the production of a multilayer ceramic substrate by laminating and sintering pluralities of ceramic green sheets with conductor patterns, high fillability and packing density can be achieved by filling via-holes of the ceramic green sheets with a conductive paste comprising fine Ag powder and a small amount of Pd powder. The present invention has been completed based on such finding.

The conductive paste of the present invention, which is filled into via-holes of a multilayer ceramic substrate formed by laminating and sintering pluralities of ceramic green sheets, comprises 88-94% by mass of Ag powder having an average particle size of 3 μm or less and 0.1-3% by mass of Pd powder, the total amount of the Ag powder and the Pd powder in the conductive paste being 88.1-95% by mass.

The ratio of the average particle size of the Pd powder to that of the Ag powder is preferably 0.03-1. The conductive paste of the present invention preferably does not contain a glass component.

The conductive paste of the present invention is particularly effective for ceramic green sheets having via-holes of about 120 μm or less in diameter with aspect ratios (length/diameter) of 1 or more, the via-holes after sintering having diameters of about 150 μm or less and aspect ratios of 0.2-1. In the case of the shrinkage-constraining method, the via-holes should have as extremely large aspect ratios as 1-2.5 at the time of printing a conductive paste, to have the aspect ratios of 0.2-1 after sintering.

The multilayer ceramic substrate of the present invention obtained by laminating and sintering pluralities of ceramic green sheets has conductor patterns and via-conductors, the via-conductors being formed in via-holes having diameters of 150 μm or less after sintering, containing Ag crystal particles having a particle size of 25 μm or more, and having a porosity of 10% or less.

The area ratio of the Ag crystal particles having a particle size of 25 μm or more in the via-conductors is preferably 5-50%. The Ag crystal particles preferably have an average particle size of 12-20 μm. The equivalent-circle diameters of the voids are preferably 15 μm or less.

The via-conductors preferably are formed by any one of the above conductive pastes.

The method of the present invention for producing a multilayer ceramic substrate comprises the steps of laminating pluralities of ceramic green sheets provided with conductor patterns and/or via-conductors; sintering a laminate of the ceramic green sheets, while upper and/or lower surfaces of which are closely attached to constraining green sheets comprising inorganic particles not sinterable at the sintering temperature of the ceramic green sheets and an organic material; and then removing the constraining green sheet, the via-holes being filled with the above conductive paste.

DESCRIPTION OF THE PREFERRED EMBODIMENTS

Figure 1A:
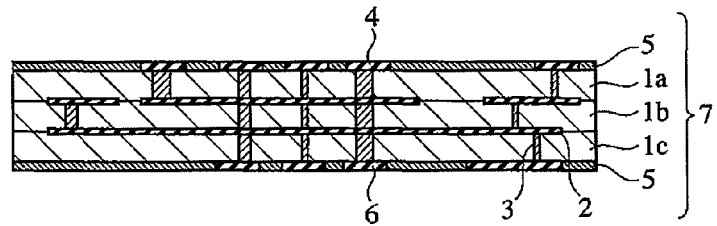
FIG. 1(a) is a cross-sectional view showing an example of one step in the production of a multilayer ceramic substrate.

[1] Structure
(1) Multilayer Ceramic Substrate

Shrinkage occurs in the formation of a multilayer ceramic substrate by the sintering of ceramic green sheets, resulting in via-holes having decreased depth (corresponding to the thickness of sheets) and enlarged diameters. This tendency is apparent particularly in the shrinkage-constraining method. In addition, because via-holes have large aspect ratios (length/diameter), it is difficult to densely fill via-holes having as small diameters as about 150 μm or less after sintering with a conductive paste. The present invention is characterized in using a conductive paste having such a composition that Ag crystal particles, fine before sintering, remarkably grow by sintering to prevent sintering shrinkage. Namely, some of the Ag crystal particles grow to 25 μm or more by sintering, thereby obtaining via-conductors having small porosity even if the diameters of the via-holes expand by sintering. However, because excessive growth rather provides the Ag crystal particles with increased porosity, the maximum particle size of the Ag crystal particles is preferably 50 μm or less. The particle size of an Ag crystal particle is expressed by an equivalent-circle diameter (diameter of a circle having the same area as the area of the Ag crystal particle) determined from an SEM photograph, etc. The calculation of the area on a photograph can be conducted using area-calculating software (for instance, image-processing software NIH Image or Image J available from Image Sense Co. Ltd).

The area ratio of Ag crystal particles having particle size of 25 μm or more in the via-conductor is preferably 5-50%. The area ratio of Ag crystal particles of 25 μm or more can be determined from a scanning electron microscope photograph (SEM photograph) of the ion-polished cross section of a via-conductor, by calculating $(S/S_0) \times 100(\%)$, wherein $S_0$ is the cross section area of the via-conductor, and S is the total area of Ag crystal particles having particle size of 25 μm or more. The ion polishing is a method for polishing an exposed cross section with argon ions, which can mirror-finish a cross section like that of a multilayer ceramic substrate having both hard ceramics and soft metal. Incidentally, observation can be conducted to some extent by an optical microscope, and the area ratio can be determined from a scanning ion microscopic (SIM) image by focused ion beam (FIB).

The Ag crystal particles preferably have an average particle size of 12-20 μm. The existence of only Ag crystal particles larger than 20 μm would provide large voids. The mixture of larger Ag crystal particles and smaller Ag crystal particles prevents the generation of large voids.

The via-conductors are preferably free from voids, but complete absence of voids is difficult. In practice, the porosity may be 10% or less. The dispersion of small voids is better than the existence of large voids. The void diameters are 15 μm or less, and desirably 1 μm or less. The existence of large gaps between the multilayer ceramic substrate and the via-conductors causes the disconnection of conductors, and permits a plating liquid to penetrate into gaps (voids) exposed on the surface. These defects, however, are alleviated by the dispersion of small voids. The diameter of a void is defined as a diameter of a circle having the same area as that of the void (equivalent-circle diameter), which is determined from a SEM photograph of an ion-polished cross section. The porosity is calculated by $(Sv/S_0) \times 100(\%)$, wherein $S_0$ is a cross section area of a via-conductor, and Sv is the total area of voids.

(2) Conductive Paste

The conductive paste of the present invention comprises 88-94% by mass of Ag powder of 3 μm or less, and 0.1-3% by mass of Pd powder, the total amount of the Ag powder and the Pd powder being 88.1-95% by mass. When the total amount of the Ag powder and the Pd powder exceeds 95% by mass, the viscosity of conductive paste becomes too high. When it is less than 88.1% by mass, the resultant via-conductors have too large porosity.

The conductive paste comprises, in addition to the Ag powder and the Pd powder, an organic binder such as ethylcellulose, etc., and an organic solvent such as terpineol, butyl carbitol, etc. A combination of fine Ag powder and Pd powder provides a conductive paste having good fillability into via-holes (easiness of filling the conductive paste into the via-holes of green sheets), and via-conductors densely packed after sintering. To reduce the resistivity of via-conductors, the conductive paste preferably is free from a glass component.

(i) Ag Powder

The Ag powder preferably has an average particle size of 3 μm or less, and its amount is preferably 88-94% by mass. The use of fine Ag powder of 3 μm or less provides good fillability even into small-diameter via-holes. When the amount of the Ag powder is less than 88% by mass, the conductive paste suffers large sintering shrinkage, resulting in via-conductors with high porosity. To provide the densely packed via-conductors, the amount of Ag powder is preferably 90% by mass or more. When the amount of Ag powder exceeds 94% by mass, the viscosity of the conductive paste becomes too high.

(ii) Pd Powder

Because Pd expands at high temperatures to offset the shrinkage of Ag, the addition of the Pd powder suppresses the shrinkage of the conductive paste when sintered, thereby filling via-holes without gaps. The amount of the Pd powder added is 0.1-3% by mass. The Pd powder added within this range exhibits excellent sintering shrinkage-suppressing effect while keeping the resistivity of the via-conductors at a level posing no practical problems. When the amount of the Pd powder is less than 0.1% by mass, there is no sufficient effect of suppressing the shrinkage of Ag, resulting in gaps in the sintered via-conductors. When the amount of the Pd powder is more than 3% by mass, the via-conductors have too high resistivity. The amount of the Pd powder is preferably less than 2.5% by mass. To hold good fillability, the Pd powder preferably has an average particle size of 1 μm or less.

(iii) Pd/Ag Particle Size Ratio

Pd particles are preferably smaller than Ag particles, so that gaps between the Ag particles are filled with the Pd particles, resulting in a remarkable effect of suppressing the shrinkage of Ag by the Pd particles. The particle size ratio of the Pd powder to the Ag powder (Pd/Ag particle size ratio) is preferably 0.03-1. When the Pd/Ag particle size ratio is less than 0.03, Pd particles aggregate. When the Pd/Ag particle size ratio is more than 1, the Pd powder is distributed unevenly. In both cases, there is no sufficient effect of suppressing the shrinkage of Ag. The Pd/Ag particle size ratio is more preferably 0.1-0.5, most preferably 0.2-0.4. The Pd/Ag particle size ratio within 0.2-0.4 is preferable from the aspect of the cost and stable supply of Ag powder and Pd powder. Because the Pd powder is in the form of secondary particles, aggregates of fine primary particles, its particle size is expressed by a cumulative 50% diameter measured by a laser diffraction particle size analyzer.

[2] Production Method of Multilayer Ceramic Substrate

Figure 1B:
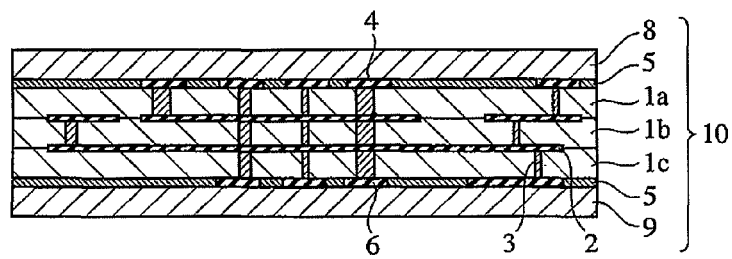
FIG. 1(b) is a cross-sectional view showing an example of another step in the production of a multilayer ceramic substrate.
Figure 1C:
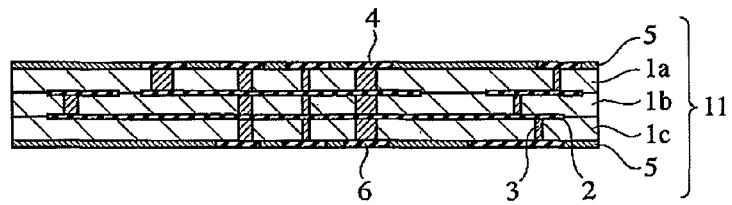
FIG. 1(c) is a cross-sectional view showing an example of a further step in the production of a multilayer ceramic substrate.
Figure 2:
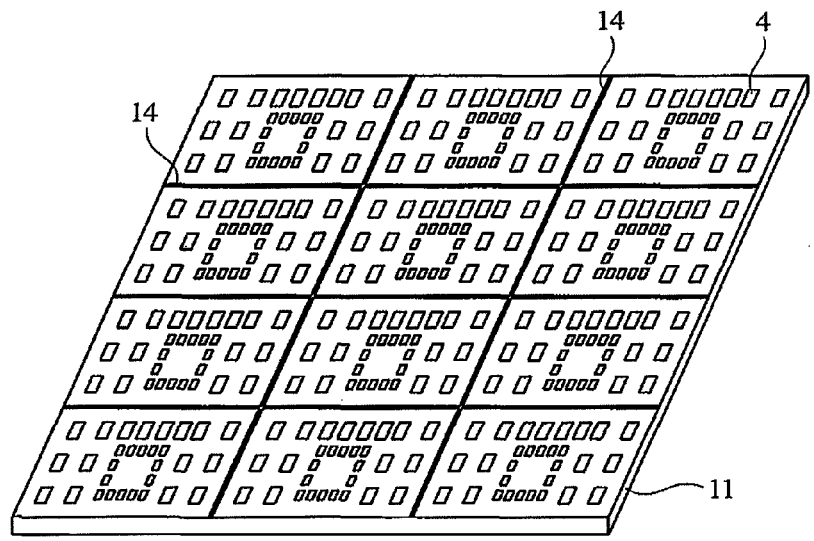
FIG. 2 is a perspective view showing an example of multilayer ceramic assembly boards.

Examples of the production steps of the multilayer ceramic substrate will be explained referring to FIGS. 1(a) to 1(c). It should be noted that the order of steps and materials are not restrictive, that pluralities of steps may be conducted simultaneously, and that some steps may be omitted if they are unnecessary depending on the objects. FIG. 2 shows an example of multilayer ceramic substrate assemblies before division.

(1) Production of Ceramic Green Sheets (i) Materials

Low-temperature-sinterable ceramic materials used for the ceramic green sheets are preferably so-called LTCC ceramics, which can be sintered simultaneously with a conductive paste of silver, etc. at 800-1000° C. Examples of the LTCC ceramics include ceramic compositions comprising 100 by mass of main components comprising 10-60% by mass (as $Al_2O_3$) of Al, 25-60% by mass (as $SiO_2$) of Si, 7.5-50% by mass (as SrO) of Sr, and 0-20% by mass (as $TiO_2$) of Ti, and sub-components comprising at least one selected from the group consisting of 0.1-10% by mass (as $Bi_2O_3$) of Bi, 0.1-5% by mass (as $Na_2O$) of Na, 0.1-5% by mass (as $K_2O$) of K, and 0.1-5% by mass (as CoO) of Co, and at least one selected from the group consisting of 0.01-5% by mass (as CuO) of Cu, 0.01-5% by mass (as $MnO_2$) of Mn, and 0.01-5% by mass of Ag. The LTCC ceramics are calcined at 700-850° C., and then pulverized to an average particle size of 0.6-2 μm.

(ii) Formation of Sheets

A carrier film (for instance, PET film) is coated with slurry comprising LTCC ceramic powder, glass powder, an organic binder, a plasticizer and a solvent at a desired thickness (about 20-200 μm) by a doctor blade method, to form pluralities of ceramic green sheets 1a, 1b, 1c . . . . The ceramic green sheets can be produced not only by a doctor blade method, but also by a rolling method, a printing method, etc.

(2) Production of Via-Conductors and Conductor Patterns

Each ceramic green sheet 1a, 1b, 1c . . . is provided with via-holes of about 60-120 μm in diameter by a laser processing method, and the via-holes are filled with a conductive paste by a printing method, etc. to form via-conductors 3. Selected ceramic green sheets are printed with a conductive paste of Ag, etc. to form conductor patterns 2 as thick as 5-35 μm. The conductor patterns 2 constitute circuit elements such as inductors, transmitting lines, capacitors, ground electrodes, etc., and lines connecting them. In the depicted example, all ceramic green sheets are provided with via-conductors 3 and conductor patterns 2. The via-conductors 3 and the conductor patterns 2 may be formed simultaneously, using the same conductive paste.

(3) Production of Multilayer Ceramic Green Body

Pluralities of ceramic green sheets 1a, 1b, 1c . . . provided with via-conductors 3 and/or conductor patterns 2 are successively thermally pressure-bonded to form a multilayer ceramic green body 7. First, an uppermost ceramic green sheet 1a attached to a carrier film is set on a fixing film, and thermally pressure-bonded, for instance, at a pressure of 10-50 kgf/cm$^2$ (0.98-4.9 MPa) and a temperature of 30-60° C. for 3-15 seconds. A thermally pressure-bonding die may be a flat plate containing a heater. After the carrier film is peeled off, the thermally pressure-bonded ceramic green sheet 1a remains attached to the fixing film.

A ceramic green sheet 1b printed with a conductor pattern 2 on a main surface is laminated as a second layer onto the ceramic green sheet 1a with the main surface down, and thermally pressure-bonded. With the pressing temperature set at a temperature at which the organic binder in the conductive paste is softened, the conductive paste is applied to the ceramic green sheet 1a, so that the ceramic green sheets 1a and 1b are bonded via the conductive paste. Ceramic portions without the conductive paste are also softened and bonded. The thermal pressure-bonding temperature may be about 40-90° C., though variable depending on the type of the organic binder. The bonding strength may be controlled by the pressing pressure. After the thermal pressure-bonding, a carrier film is removed from the ceramic green sheet 1b.

Like the ceramic green sheet 1b as the second layer, the third ceramic green sheet 1c and subsequent green sheets are successively laminated. After the lamination of all ceramic green sheets, the resultant multilayer ceramic green body 7 may further be strongly integrated by thermal pressure-bonding. The thermal pressure-bonding is preferably CIP under the conditions of 100-400 kgf/cm$^2$ (9.8-39.2 MPa) and 85° C. The thermal pressure-bonding may, of course, be conducted after breaking grooves 14 and an overcoat 5. An integral, multilayer ceramic green body 7 shown in FIG. 1(a) is thus obtained. Although FIG. 1(a) shows only three layers without restrictive intension, 10 or more green sheets may be laminated depending on the circuit structure.

The multilayer ceramic green body is printed with a conductive paste on upper and lower surfaces, to form external terminal electrodes 4, 6. An overcoat 5 may be formed around the external terminal electrodes 4, 6. The overcoat 5 preferably exhibits sintering shrinkage close to that of the multilayer ceramic green body. Accordingly, it preferably uses slurry having the same composition as that of the ceramic green sheet, to which a visibility-imparting component is added. The overcoat protects the external terminal electrodes 4, 6, and prevents short-circuiting by soldering. The external terminal electrodes 4, 6 and the overcoat 5 need not be formed on an unsintered laminate, but may be formed on a sintered, multilayer ceramic substrate assembly.

(4) Formation of Breaking Grooves

Upper and/or lower surfaces (usually both surfaces) of the multilayer ceramic green body 7 are preferably provided with longitudinal and lateral breaking grooves 14 (notched grooves) by a cutter, etc. The sintered, multilayer ceramic substrate assembly is divided along the breaking grooves 14 to obtain individual multilayer ceramic substrates. The number of divisions may be properly set depending on the sizes of the multilayer ceramic substrate assembly and the individual multilayer ceramic substrates. The depth of V-shaped breaking grooves 14 preferably is determined such that the total depth of the breaking grooves 14 on upper and lower surfaces is 30% or less of the thickness of the multilayer ceramic green body 7, for instance, about 0.01-0.2 mm.

(5) Production of Constraining Green Sheet

Produced to conduct the shrinkage-constraining method is a constraining green sheet that is not sintered at the sintering temperature of ceramic green sheets (about 800-1000° C.) to prevent the multilayer ceramic green body from shrinking. This sheet is formed by applying slurry comprising ceramic powder for the constraining green sheet, an organic binder, a plasticizer and a solvent at a predetermined dry thickness (about 100-200 μm) to a carrier film by a doctor blade method. The ceramic powder for the constraining green sheet is preferably based on alumina powder. The organic binder, the plasticizer and the solvent may be the same as used for the ceramic green sheets.

The constraining green sheets 8, 9 as thick as, for instance, about 200 μm are laminated to the upper and lower surfaces of the multilayer ceramic green body 7. Pluralities of constraining green sheets 8, 9 may be laminated to each surface. They are thermally pressure-bonded at 100-400 kgf/cm$^2$ (9.8-39.2 MPa) and 85° C. by CIP, to obtain a laminate 10 in which the constraining green sheets 8, 9 are integrally attached to both surfaces of the multilayer ceramic green body 7 as shown in FIG. 1(b).

(6) Sintering of Multilayer Ceramic Body Having Constraining Layers and Removal of Constraining Layers The laminate 10 integrally having the constraining green sheets (constraining layers) 8, 9 is heated at 800-1000° C. to conduct the sintering of the multilayer ceramic green body and the removal of the binder from the constraining layers. The unsintered constraining layers are removed from the sintered multilayer ceramic body by ultrasonic cleaning, blasting, etc., to obtain the multilayer ceramic substrate assembly 11 shown in FIG. 1(c).

The multilayer ceramic substrate assembly 11 has pluralities of multilayer ceramic substrates partitioned by breaking grooves 14 in a lattice pattern as shown in FIG. 2. The breaking or dicing of the multilayer ceramic substrate assembly 11 along the breaking grooves 14 provides individual multilayer ceramic substrates. Thus, the multilayer ceramic substrates can be efficiently produced by forming the substrate assembly 11 and dividing it.

(7) Multilayer Ceramic Substrate

Sintering provides the multilayer ceramic substrate with enlarged via-holes. For instance, via-holes of 120 μm, 80 μm, and 60 μm in diameter at the stage of a green sheet are expanded to about 150 μm, about 100 μm, and about 80 μm, respectively, by thermal pressure bonding and/or sintering. The conductor in the via-hole contains 5-50% by area of Ag crystal particles grown to a particle size of 25 μm or more. Ag crystal particles in the via-conductor preferably have an average particle size of 12-20 μm. The via-conductor has a porosity of 10% or less. To avoid insulation failure, voids preferably have an average diameter (equivalent-circle diameter) of 15 μm or less. The via-conductor is free from large voids, permitting close contact between the multilayer ceramic substrate and the via-conductor without large gap. However, the porosity differs, depending on the conductive paste and the diameters of via-holes. The Ag crystal particles in the via-conductor and its porosity can be determined from a scanning electron microscope photograph of an ion-polished cross section in a lamination direction of the via-conductor.

The present invention will be explained in more detail referring to Examples below without intention of restricting the scope of the present invention.

EXAMPLE 1

A ceramic composition comprising 100 parts by mass of main components comprising 48% by mass of $Al_2O_3$, 38% by mass of $SiO_2$, 10% by mass of SrO and 4% by mass of $TiO_2$, 2.5 parts by mass of $Bi_2O_3$, 2 parts by mass of $Na_2O$, 0.5 parts by mass of $K_2O$, 0.3 parts by mass of CuO, and 0.5 parts by mass of $MnO_2$ was calcined at 800° C. for 2 hours, and finely pulverized by a ball mill for 20 hours to obtain ceramic powder having an average particle size of about 1 μm. 100 parts by mass of this ceramic powder was mixed with 15 parts by mass of polyvinyl butyral (PVB) as an organic binder, 10 parts by mass of bis(2-ethlhexyl) phthalate (DOP) as a plasticizer, and ethanol and butanol as solvents, and dispersed by a stirrer for 4 hours. The resultant slurry was defoamed by reduced pressure to evaporate part of the solvents, and applied onto a carrier film by a doctor blade method to form 5 types of ceramic green sheets as thick as 35 μm, 60 μm, 120 μm, 150 μm and 190 μm, respectively. Each ceramic green sheet was cut to a predetermined size together with the carrier film, and provided with 3 types of via-holes having diameters of 120 μm, 80 μm and 60 μm, respectively, by a laser processing method. Because a via-hole formed by a laser was tapered, the diameter on the wider side was defined as the diameter of the via-hole.

100 parts by mass of conductor powder comprising Ag powder or Ag powder and Pd powder in the formulation shown in Table 1 was blended with 5-14 parts by mass of ethylcellulose in terpineol by a three-roll apparatus, to prepare a conductive paste. Via-holes in the ceramic green sheets were filled with the conductive paste by a printing method. An Ag paste was further screen-printed to the ceramic green sheets to form conductor patterns. Incidentally, the via-holes and the conductor pattern may be printed simultaneously.

Pluralities of ceramic green sheets were successively positioned, and preliminarily subjected to thermal pressure-bonding at about 50° C. and 40 kgf/cm² (3.9 MPa) to obtain a multilayer ceramic green body having 17 layers comprising four 35-μm layers, four 60-μm layers, three 120-μm layers, three 150-μm layers, and three 190-μm layers. After a surface of the multilayer ceramic green body was provided with breaking grooves by a cutter, a surface conductor pattern and an overcoat were formed. The resultant laminate was thermally pressure-bonded by CIP at 100 kgf/cm² (9.8 MPa) and 85° C. to obtain an integral, multilayer ceramic green body.

100 parts by mass of alumina powder having an average particle size of 15 μm was mixed with 5 parts by mass of PVB as an organic binder, 3 parts by mass of DOP as a plasticizer, and ethanol and butanol as solvents, and dispersed by a ball mill for 10 hours to obtain slurry for constraining green sheets. After the slurry was defoamed by reduced pressure to evaporate part of the solvents, the constraining green sheet was formed on a carrier film by a doctor blade method. The constraining green sheet peeled from the carrier film was cut to the same size as that of the multilayer ceramic green body. The resultant 190-μm-thick constraining green sheet was thermally pressure-bonded to both surfaces of the multilayer ceramic green body by CIP at 120 kgf/cm² (11.8 MPa) and 85° C., so that they became integral.

After the binder was removed from the resultant laminate, it was kept at 900° C. for 2 hours to obtain a sintered multilayer ceramic body (multilayer ceramic assembly board). After removing the constraining layers from the sintered multilayer ceramic body by ultrasonic cleaning, the sintered multilayer ceramic body was divided along the breaking grooves to obtain 90 multilayer ceramic substrate samples.

The multilayer ceramic substrate sample was cut to measure the thickness of each layer and the diameters of via-holes. As a result, it was confirmed that sintering turned a 120-μm-thick green sheet to 45-μm-thick layer, and the diameters of via-holes from 120 μm, 80 μm and 60 μm to 150 μm, 100 μm and 80 μm, respectively.

The cross section of each via-conductor was ion-polished and observed by SEM at an acceleration voltage of 10 kV. The cross section of three layers each about 45 μm was observed in each multilayer ceramic substrate sample. The results are shown in Table 1. Via-conductors having diameters of 150 μm, 100 μm and 80 μm, respectively, after sintering were measured with respect to area ratios and maximum diameters (maximum equivalent-circle diameter), and their packing density (fillability) was evaluated according to the following standards.

Area Ratio of Voids
Excellent: When the area ratio was less than 10%.
Good: When the area ratio was 10-20%.
Poor: When the area ratio was more than 20%.
Maximum Diameter of Voids
Excellent: When the maximum diameter was less than 10 μm.
Good: When the maximum diameter was 10-15 μm.
Poor: When the maximum diameter was more than 15 μm.

Using lines of 65 mm in length and 0.2 mm in width made of the same conductor material as the via-conductors, the resistivity $\rho(=R \times A/L)$ of the via-conductors was measured, wherein R was an average resistance measured on 10 line, A was an average cross section area measured at three points on each line, and L was the length of each line, and evaluated according to the following standards.

Evaluation of Resistivity
Excellent: When the resistivity was less than $3.0 \times 10^{-8}$ Ω·m.
Good: When the resistivity was $3.0 \times 10^{-8}$ to $4.5 \times 10^{-8}$ Ω·m.
Poor: When the resistivity was more than $4.5 \times 10^{-8}$ Ω·m.

The area ratios and maximum diameters of voids in the via-conductors and the resistivity of the via-conductors are shown in Table 1. In their evaluation, Excellent means an excellent range, Good means a practically acceptable range, and Poor means a practically unacceptable range. The evaluation of Good or higher is regarded as satisfactory.

TABLE 1

| Type of Paste | Ag Powder % by mass | Ag Powder Average Particle Size (μm) | Pd Powder % by mass | Pd Powder Average Particle Size (μm) | Pd/Ag Particle Size Ratio | Ag + Pd (% by mass) | Glass (% by mass) |
|---|---|---|---|---|---|---|---|
| 1* | 88 | 2.5 | 0 | — | — | 88.0 | 0 |
| 2 | 88 | 2.5 | 0.5 | 0.5 | 0.2 | 88.5 | 0 |
| 3 | 88 | 2.5 | 0.3 | 0.5 | 0.2 | 88.3 | 0 |
| 4 | 93 | 2.5 | 0.5 | 0.5 | 0.2 | 93.5 | 0 |
| 5* | 91.5 | 5 | 0.5 | 1 | 0.2 | 92.0 | 1 |
| 6* | 95 | 2.5 | 0.5 | 0.5 | 0.2 | 95.5 | 0 |
| 7* | 86 | 2.5 | 0.5 | 0.5 | 0.2 | 86.5 | 0 |
| 8 | 88 | 2.0 | 0.5 | 0.5 | 0.25 | 88.5 | 0 |
| 9* | 88 | 3.5 | 0.5 | 0.5 | 0.14 | 88.5 | 0 |
| 10* | 88 | 2.5 | 3.0 | 0.5 | 0.2 | 91.0 | 0 |
| 11 | 88 | 2.5 | 0.2 | 0.5 | 0.2 | 88.2 | 0 |
| 12 | 88 | 2.5 | 2.5 | 0.5 | 0.2 | 90.5 | 0 |
| 13 | 93 | 2.5 | 0.2 | 0.5 | 0.2 | 93.2 | 0 |
| 14 | 93 | 2.5 | 0.1 | 0.5 | 0.2 | 93.1 | 0 |
| 15 | 88 | 2.5 | 0.1 | 0.5 | 0.2 | 88.1 | 0 |
| 16* | 93 | 2.5 | 0 | — | — | 93.0 | 0 |
| 17 | 93 | 2.5 | 0.5 | 0.1 | 0.04 | 93.5 | 0 |
| 18 | 93 | 2.5 | 0.5 | 2 | 0.8 | 93.5 | 0 |
| 19* | 93 | 2.5 | 0.5 | 3 | 1.2 | 93.5 | 0 |

| Type of Paste | Packing Density in Via-Holes Having Each Diameter After Sintering 150 μm | 100 μm | 80 μm | Resistivity |
|---|---|---|---|---|
| 1* | Poor | Poor | Poor | Excellent |
| 2 | Excellent | Excellent | Excellent | Excellent |
| 3 | Excellent | Excellent | Good | Excellent |
| 4 | Excellent | Excellent | Excellent | Excellent |
| 5* | Good | Poor | Poor | Good |
| 6* | Poor | Poor | Poor | Excellent |
| 7* | Poor | Poor | Poor | Excellent |
| 8 | Excellent | Excellent | Excellent | Excellent |
| 9* | Good | Good | Poor | Excellent |
| 10* | Excellent | Excellent | Excellent | Poor |
| 11 | Excellent | Good | Good | Excellent |
| 12 | Excellent | Excellent | Excellent | Good |
| 13 | Excellent | Excellent | Excellent | Excellent |
| 14 | Excellent | Excellent | Excellent | Excellent |
| 15 | Excellent | Good | Good | Excellent |
| 16* | Poor | Poor | Poor | Excellent |
| 17 | Excellent | Excellent | Excellent | Excellent |
| 18 | Excellent | Good | Good | Excellent |
| 19* | Poor | Poor | Poor | Excellent |

Note:
*Outside the present invention.

As shown in Table 1, the via-conductors made of the pastes 1 and 16 containing no Pd suffered large shrinkage in all via-holes having diameters of 150 μm, 100 μm and 80 μm, resulting in large gaps between the via-conductors and the ceramic, meaning poor packing density. The paste 5 containing Ag powder having as large an average particle size as 5 μm had poor fillability into via-holes having diameters of 100 μm and 80 μm, resulting in voids in the via-conductors. In addition, they had high resistivity because of 1% by mass of glass. The paste 6 containing 95% by mass of Ag powder did not have printable viscosity of 100-400 Pa·s (good printability), so that it could not be filled into via-holes. The via-conductors formed by the paste 7 containing 88% by mass of Ag powder suffered large shrinkage, resulting in gaps between the via-conductors and the ceramic, meaning poor packing density of the via-conductors. The paste 9 containing Ag powder having an average particle size of 3.5 μm had poor fillability, resulting in voids in via-conductors when the via-holes had a diameter of 80 μm. The paste 10 containing 3.0% by mass of Pd powder had high resistivity. Because Pd particles were unevenly distributed in the paste 19 having a Pd/Ag particle size ratio of 1.2, there was only a small effect of suppressing the shrinkage of Ag, resulting in voids in the via-conductors.

On the contrary, the pastes 2-4,8,11-15, 17 and 18 within the present invention had excellent packing into via-holes having as small diameters as 100 μm and 80 μm. Sintering turned the length of via-holes in the 120-μm-thick green sheet from about 120 μm to about 45 μm, and the aspect ratios of the via-holes from 1.0-2.0 to 0.3-0.56, but their fillability and packing density were on a level posing no practical problems. Including other green sheets of 35-190 μm in thickness, sintering turned the aspect ratios from 0.28-3.2 to 0.1-1.1, but the via-conductors exhibited good fillability and packing density. The pastes of the present invention exhibited excellent fillability even to via-holes having diameters of about 120 μm or less and aspect ratios of 1 or more.

EXAMPLE 2

Those shown in Table 2 among the multilayer ceramic substrate samples produced in Example 1 were measured with respect to the maximum, average and minimum particle sizes of Ag crystals and the area ratio of Ag crystal particles having particle sizes of 25 μm or more in the via-conductors, and the maximum void diameter, porosity and insulation failure ratio of the via-conductors. With respect to each property, each sample was measured at five points, and the measured values were averaged. The results are shown in Table 2.

Figure 3:
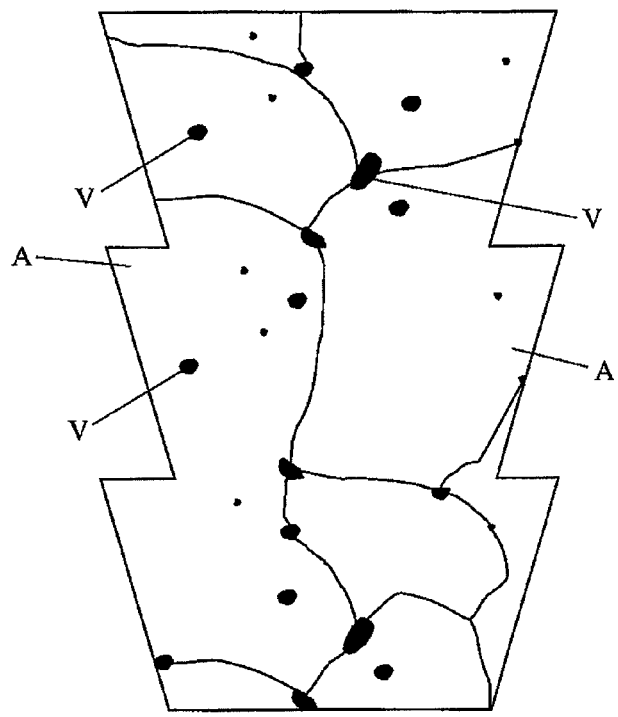
FIG. 3 is a schematic view showing Ag crystal particles and voids in a via-hole made of the conductor paste of the present invention.
Figure 4:
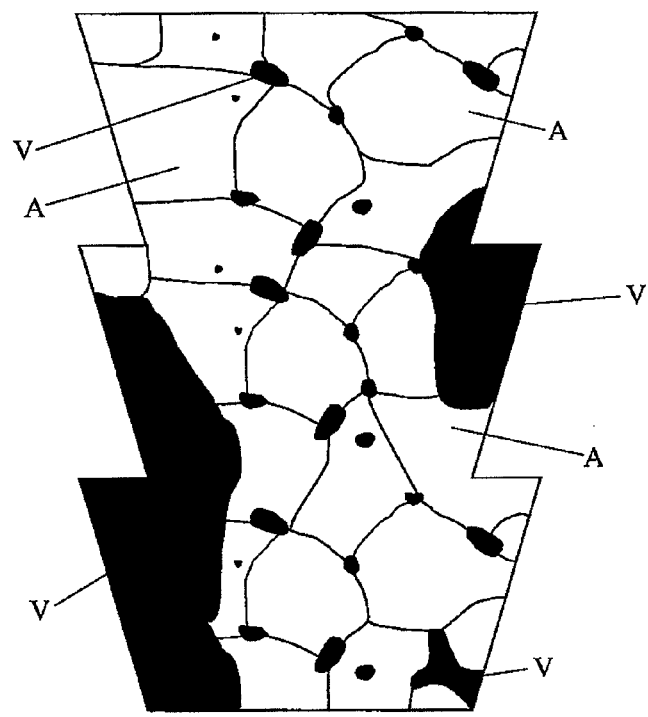
FIG. 4 is a schematic view showing Ag crystal particles and voids in a via-hole made of a conductor paste outside the present invention.

Ag crystal particles in the via-conductors and the porosity of the via-conductors were determined from backscattered electron image obtained by observing an ion-polished cross section of the via-conductor in a lamination direction by a scanning electron microscope (acceleration voltage 10 kV). FIGS. 3 and 4 show the schematic cross sections of the via-conductors depicted based on the backscattered electron image. FIG. 3 shows Ag crystal particles in the via-conductor produced by the paste 13 (within the present invention), and FIG. 4 shows Ag crystal particles in the via-conductor produced by the paste 1 (outside the present invention). In both figures, white portions A are Ag crystal particles, and black portions V are voids. The particle size of an Ag crystal particle was calculated as a diameter of a circle having the same area. As is clear from FIGS. 3 and 4, the via-conductors of the present invention had slight voids, while those of Comparative Example had large voids.

With DC voltage of 100 V applied to the multilayer ceramic substrate samples, their insulation failure ratios were determined assuming that the sample had insulation failure when its resistance was less than 100 MΩ. The insulation measurement was conducted between 5 types of paths on each sample, and the measured values were averaged. The results are shown in Table 2.

TABLE 2

| Type of Paste | Diameter of Via-Hole After Sintering (μm) | Diameters of Ag Crystal Particles (μm) | | | Area Ratio (%) of Ag Crystal Particles ≧ 25 μm |
|---|---|---|---|---|---|
| | | Maximum | Average | Minimum | |
| 2 | 100 | 29.2 | 13.5 | 4.5 | 16.4 |
| 2 | 80 | 32.0 | 14.7 | 7.5 | 5.1 |
| 4 | 100 | 40.6 | 17.3 | 8.4 | 25.9 |
| 4 | 80 | 28.8 | 16.1 | 4.0 | 7.4 |
| 13 | 80 | 38.2 | 17.8 | 7.4 | 47.2 |
| 14 | 80 | 31.0 | 16.0 | 4.5 | 32.0 |
| 15 | 100 | 35.0 | 15.1 | 8.4 | 39.3 |
| 15 | 80 | 29.2 | 15.5 | 6.0 | 25.1 |
| 17 | 100 | 27.2 | 13.5 | 6.7 | 6.2 |
| 17 | 80 | 26.8 | 12.8 | 5.3 | 7.0 |
| 1* | 100 | 26.2 | 15.8 | 8.6 | 12.5 |
| 5* | 100 | 21.6 | 10.3 | 3.6 | 0* |
| 5* | 80 | 22.0 | 12.2 | 7.0 | 0 |
| 19* | 100 | 26.1 | 14.0 | 8.4 | 10.1 |
| 19* | 80 | 23.5 | 13.2 | 7.2 | 0 |

| Type of Paste | Diameter of Via-Hole After Sintering (μm) | Voids | | Insulation Failure Ratio (%) |
|---|---|---|---|---|
| | | Maximum Diameter (μm) | Porosity (%) | |
| 2 | 100 | 9 | 7.8 | 0 |
| 2 | 80 | 8 | 5.7 | 0 |
| 4 | 100 | 8 | 6.2 | 0 |
| 4 | 80 | 8 | 5.6 | 0 |
| 13 | 80 | 8 | 6.7 | 0 |
| 14 | 80 | 9 | 7.8 | 0 |
| 15 | 100 | 10 | 9.2 | 0 |
| 15 | 80 | 11 | 8.5 | 0 |
| 17 | 100 | 9 | 8.7 | 0 |
| 17 | 80 | 9 | 8.2 | 0 |
| 1* | 100 | 25 | 20.4 | 13.0 |
| 5* | 100 | 22 | 12.2 | 1.5 |
| 5* | 80 | 18 | 14.0 | 1.7 |
| 19* | 100 | 25 | 17.2 | 5.5 |
| 19* | 80 | 17 | 15.3 | 2.2 |

Note:
*Outside the present invention.

The paste 5 containing Ag powder having a particle size of 5 μm or more (Comparative Example) had such poor fillability that as large voids as 15 μm or more were produced in via-conductors with porosity of more than 10%, in both cases where via-holes had diameters of 100 μm and 80 μm. The Ag crystal particles had an average particle size of less than 12 μm in the via-holes having a diameter of 100 μm, and a maximum particle size of less than 25 μm in via-holes having diameters of 100 μm and 80 μm, respectively. The insulation failure ratio was 1.5% or more. It is considered that the deterioration of insulation occurred because a plating liquid intruded into via-holes through voids of the via-conductors exposed on the surface.

In the case of the paste 1 containing 100% Ag without Pd (Comparative Example), large voids were produced at the time of sintering, because there was no effect by Pd to suppress the shrinkage of Ag. Accordingly, the insulation failure ratio was as extremely high as 10% or more. As in the case of the paste 5, it is considered that a plating liquid intruded into via-holes through voids exposed on the surface.

In the case of the paste 19 having a Pd/Ag particle size ratio of more than 1 (Comparative Example), Pd particles were unevenly distributed in the paste, thereby unevenly suppressing the shrinkage of Ag. As a result, as large voids as 15 μm or more were generated in the via-conductors, with a porosity of more than 10%. Accordingly, the insulation failure ratio was as large as 2.2%.

On the other hand, the pastes 2, 4, 13, 14, 15, 17 of the present invention provided as small via-holes as 100 μm and 80 μm in diameter with porosities of 10% or less and void diameters of 15 μm or less, exhibiting excellent packing density. In any case, Ag crystal particles had an average diameter of 12 μm or more, and some of them were 25 μm or more. Accordingly, high-reliability, multilayer ceramic substrates with insulation failure ratios of 0% were obtained. The same tendency is expected on via-holes having diameters of 150 μm after sintering.

Effect of the Invention

Because the conductive paste of the present invention has sufficiently low resistivity and excellent fillability into small-diameter via-holes (excellent packing density), with suppressed shrinkage when sintered, it can provide flawless, multilayer ceramic substrates with high connection reliability. The use of the conductive paste of the present invention having such features in a shrinkage-constraining method can provide multilayer ceramic substrates with high connection reliability and excellent dimensional precision.

What is claimed is:

1. A conductive paste filled into via-holes of a multilayer ceramic substrate formed by laminating and sintering pluralities of ceramic green sheets, and containing 88-94% by mass of Ag powder having an average particle size of 2.5 μm or less and 0.1-3% by mass of Pd powder, wherein the total amount of said Ag powder and said Pd powder in said conductive paste is 88.1-95% by mass, and wherein a glass component is not contained.

2. The conductive paste according to claim 1, wherein the ratio of the average particle size of said Pd powder to that of said Ag powder is 0.03-1.

3. A method for producing a multilayer ceramic substrate comprising the steps of laminating pluralities of ceramic green sheets provided with conductor patterns and/or via-conductors; sintering a laminate of said ceramic green sheets, upper and/or lower surfaces of which are closely attached to a constraining green sheet comprising inorganic particles not sinterable at the sintering temperature of said ceramic green sheets and an organic material; and then removing said constraining green sheet; wherein the via-holes are filled with a conductive paste containing 88-94% by mass of Ag powder having an average particle size of 2.5 μm or less and 0.1-3% by mass of Pd powder, wherein the total amount of said Ag powder and said Pd powder in said conductive paste is 88.1-95% by mass, and wherein said conductive paste does not contain a glass component.

4. A multilayer ceramic substrate having conductor patterns and via-conductors inside, said via conductors being formed in via-holes having diameters of 150 μm or less after sintering, containing Ag crystal particles having a particle size of 25 μm or more, and having a porosity of 10% or less, wherein said via-conductors are formed by a conductive paste filled into via-holes of said multilayer ceramic substrate formed by laminating and sintering pluralities of ceramic green sheets, said conductive paste containing 88-94% by mass of Ag powder having an average particle size of 2.5 μm or less and 0.1-3% by mass of Pd powder, wherein the total amount of said Ag powder and said Pd powder in said conductive paste is 88.1-95% by mass and wherein the ratio of the average particle size of said Pd powder to that of said Ag powder in said conductive paste is 0.03-1 and wherein said conductive paste does not contain a glass component.

5. The multilayer ceramic substrate according to claim 4, wherein aspect ratios of the via-holes are 0.2-1.

* * * * *